United States Patent
Ito et al.

(10) Patent No.: US 7,186,575 B2
(45) Date of Patent: Mar. 6, 2007

(54) MANUFACTURING METHOD OF SEMICONDUCTOR DEVICE

(75) Inventors: Daisuke Ito, Nagano (JP); Toshimi Kawahara, Nagano (JP)

(73) Assignee: Shinko Electric Industries Co., Ltd, Nagano (JP)

( * ) Notice: Subject to any disclaimer, the term of this patent is extended or adjusted under 35 U.S.C. 154(b) by 103 days.

(21) Appl. No.: 11/064,500

(22) Filed: Feb. 23, 2005

(65) Prior Publication Data

US 2005/0191772 A1    Sep. 1, 2005

(30) Foreign Application Priority Data

Feb. 26, 2004    (JP)    ............... 2004-050652

(51) Int. Cl.
*H01L 31/26*    (2006.01)
*H01L 21/66*    (2006.01)
(52) U.S. Cl. .................................... 438/14; 257/668
(58) Field of Classification Search ............... 438/14, 438/166, 478, 497, 660; 257/668, 737, 738
See application file for complete search history.

(56) References Cited

U.S. PATENT DOCUMENTS 6,395,622 B1 *    5/2002    Liu et al. ................... 438/497
6,822,317 B1 *    11/2004   Inoue et al. ................ 257/668
6,963,136 B2 *    11/2005   Shinozaki et al. .......... 257/759

FOREIGN PATENT DOCUMENTS

| JP | 8-330313 | 12/1996 |
|---|---|---|
| JP | 10-79362 | 3/1998 |
| JP | 2004-031463 | 1/2004 |

* cited by examiner

Primary Examiner—Phuc T. Dang
(74) Attorney, Agent, or Firm—Rankin, Hill, Porter & Clark LLP

(57) ABSTRACT

In a method for manufacturing a semiconductor device by processing of a wafer level, in the case of forming the semiconductor device at the wafer level, on the basis of inspection results on individual semiconductor chips constituting a semiconductor wafer, a treatment for forming a circuit including a rewiring pattern is performed with respect to a semiconductor chip judged as a conforming product and a treatment in which a rewiring pattern is not formed in order to avoid having adverse influence on a semiconductor device of a conforming product or an inspection apparatus in an inspection of a formed semiconductor device after forming the semiconductor device is performed with respect to a semiconductor chip judged as a nonconforming product.

5 Claims, 13 Drawing Sheets

MANUFACTURING METHOD OF SEMICONDUCTOR DEVICE

This application claims foreign priority based on Japanese patent application JP 2004-050652, filed on Feb. 26, 2004, the contents of which is incorporated herein by reference in its entirety.

BACKGROUND OF THE INVENTION

1. Field of the Invention

The present invention relates to a manufacturing method of a semiconductor device, and more specifically to a manufacturing method of a semiconductor device by processing of a wafer level.

2. Description of the Related Art

A method for manufacturing a semiconductor device by processing of a wafer level has been performed as a method for manufacturing a semiconductor device of a chip size package etc. For example, as a method for manufacturing a chip size package using processing of a wafer level, there is a following manufacturing method of a semiconductor device of a chip size. That is, in a semiconductor wafer, a rewiring pattern is formed so that it is electrically connected to electrode terminals of individual semiconductor chips formed in the semiconductor wafer, and an external connection terminal is formed so that it is electrically connected to the rewiring pattern. Then a surface in which the external connection terminal of the semiconductor wafer is formed is sealed by resin, and the semiconductor wafer is cut into individual segments together with the resin after the sealing (for example, see JP-A-10-79362 and JP-A-8-330313).

In the method for manufacturing a semiconductor device by such a processing of a wafer level, a plurality of semiconductor devices with the same structure are formed on the semiconductor wafer in arrangement aligned in length and width. These semiconductor devices are mounted on a substrate etc. respectively, after being cut into individual segments. Before the semiconductor devices are mounted on the substrate etc., conformity and nonconformity of electrical characteristics etc. of the respective semiconductor devices are judged by inspection and only conforming semiconductor devices are mounted on the substrate etc. Incidentally, inspection for judgment of conformity and nonconformity of a product is actually made at each stage of a manufacturing process of the semiconductor device. For example, at a stage of manufacturing the semiconductor wafer, inspection of conformity and nonconformity of electrical characteristics etc. of individual semiconductor chips formed in the semiconductor wafer is also made (for example, see JP-A-2004-31463).

As described above, product inspection is made at each of the manufacturing stages in the manufacturing process of the semiconductor device. For example, at a stage of manufacturing the semiconductor wafer, characteristics of individual semiconductor chips are also tested. However, in the related-art manufacturing process of the semiconductor device of a wafer level, regardless of an inspection result at a stage of the semiconductor wafer, rewiring patterns or external connection terminals are formed with respect to all the semiconductor chips. That is, the rewiring patterns or external connection terminals are formed with respect to semiconductor chips judged as conforming product and also with respect to semiconductor chips judged as nonconforming product. This is because in the manufacturing process, it is difficult not to form the rewiring pattern etc. on only the semiconductor chips judged as nonconforming product. Generally, a resist pattern for forming the rewiring pattern is formed by a photolithographic process using an exposure mask. Therefore, in order to perform exposure so as not to form the resist pattern on the nonconforming semiconductor chips, a mask with special shape in which an unexposed portion is provided in accordance with a position of the nonconforming semiconductor chips must be prepared. Since occurrence positions of the nonconforming semiconductor chips vary depending on the respective semiconductor wafers, it is actually impossible to prepare such a mask with special shape.

Then, after the required rewiring patterns or external connection terminals are formed, electrical characteristics or appearances, etc. of individual semiconductor device formed on the semiconductor wafer are inspected.

Thus, in the related art, the rewiring patterns etc. are formed to manufacture the semiconductor device at a wafer level regardless of the inspection result of the semiconductor chips at the manufacturing stage of the semiconductor wafer. Therefore, there were problems that in the case of inspecting a formed semiconductor device, accurate inspection cannot be made or an inspection apparatus is damaged or adverse influence on other conforming semiconductor device is had.

For example, when burn-in of a semiconductor device is performed in the case that a nonconforming semiconductor chip is electrically short-circuited, there arise problems that an overcurrent flows in a semiconductor device equipped with its nonconforming semiconductor chip thereby damaging an inspection apparatus or a conforming semiconductor device disposed near to the nonconforming semiconductor device comes under the adverse influence of the nonconforming semiconductor device thereby becoming a nonconforming semiconductor device.

SUMMARY OF THE INVENTION

An object of the present invention is to provide a manufacturing method of a semiconductor device capable of making accurate inspection without damaging an inspection apparatus or having adverse influence on a conforming semiconductor device in the case of inspecting electrical characteristics etc. with respect to a manufactured semiconductor device, in a process of manufacturing the semiconductor device by processing of a wafer level.

The present invention comprises the following configurations in order to achieve the object.

That is, a method for manufacturing a semiconductor device by processing of a wafer level, comprises: in the case of forming the semiconductor device at the wafer level, performing a treatment for forming a circuit including a rewiring pattern with respect to a semiconductor chip judged as a conforming product on the basis of inspection results on individual semiconductor chips constituting a semiconductor wafer; and performing a treatment for avoiding having adverse influence on a semiconductor device of a conforming product or an inspection apparatus in an inspection of a formed semiconductor device after forming the semiconductor device with respect to a semiconductor chip judged as a nonconforming product on the basis of the inspection results on individual semiconductor chips.

Also, the treatment for avoiding having adverse influence on the semiconductor device of the conforming product or the inspection apparatus in the inspection of the formed semiconductor device after forming the semiconductor device with respect to the semiconductor chip judged as the nonconforming product may be a treatment in which the semiconductor chip is electrically disconnected from a circuit electrically connected to an electrode pad of the semiconductor chip. The circuit electrically connected to the electrode pad of the semiconductor chip includes a rewiring pattern connected to the electrode pad, and an external connection terminal etc. formed by joining a solder ball or by plating.

Further, in the case of forming the semiconductor device at the wafer level, a rewiring pattern for electrically connecting an electrode pad to an external connection terminal may be formed with respect to the semiconductor chip judged as the conforming product, and, the rewiring pattern may not be formed with respect to the semiconductor chip judged as the nonconforming product and it is formed in a state of electrically disconnecting the electrode pad from the external connection terminal. As a result of this, the semiconductor chip judged as the nonconforming product is electrically disconnected from the external connection terminal, and in the case of inspecting the semiconductor device in a post-process, the semiconductor chip judged as the nonconforming product does not have adverse influence on an inspection apparatus etc. and accurate inspection etc. can be made.

A method in which with respect to the semiconductor chip judged as the nonconforming product, the rewiring pattern is not formed and the electrode pad is electrically disconnected from the external connection terminal may be a method in which an undercoat metal layer is formed on an electrode terminal formation surface of the semiconductor wafer and a resist pattern to which a region for forming the rewiring pattern electrically connected to the electrode pad of the semiconductor chip is exposed is formed on a surface of the undercoat metal layer and then, with respect to the semiconductor chip judged as the nonconforming product, a resist is applied to the region for forming the rewiring pattern and the region for forming the rewiring pattern is coated with the resist and then, a plating using the undercoat metal layer as a plating feeding layer is performed with respect to the semiconductor wafer and a conductor layer resulting in the rewiring pattern is formed in only the semiconductor chip judged as the conforming product.

Alternatively, a method in which with respect to the semiconductor chip judged as the nonconforming product, the rewiring pattern is not formed and the electrode pad is electrically disconnected from the external connection terminal may be a method in which an undercoat metal layer is formed on an electrode terminal formation surface of the semiconductor wafer, and a resist pattern, to which a region for forming the rewiring pattern electrically connected to the electrode pad of the semiconductor chip is exposed and which coats the region for forming the rewiring pattern with respect to the semiconductor chip judged as the nonconforming product, is formed on a surface of the undercoat metal layer, and then, a plating using the undercoat metal layer as a plating feeding layer is performed with respect to the semiconductor wafer and a conductor layer resulting in the rewiring pattern is formed in only the semiconductor chip judged as the conforming product.

According to a manufacturing method of a semiconductor device in accordance with the present invention, in the case of forming the semiconductor device by processing of a wafer level, with respect to a semiconductor chip judged as a nonconforming product on the basis of inspection results in a semiconductor wafer, a treatment without having adverse influence on a semiconductor device of a conforming product or damaging an inspection apparatus in the case of burn-in or inspection in a post-process is performed, independently of a semiconductor chip judged as a conforming product. Therefore, the damage etc. to the inspection apparatus can be avoided to make accurate inspection etc.

DETAILED DESCRIPTION OF THE INVENTION

Hereinafter, exemplary, non-limiting embodiments of the invention will be explained with reference to the accompanying drawings. In the present invention, terms are presumed to have their ordinary meaning as would be understood by one of ordinary skill in the relevant art. However, terms may also be operationally defined in this disclosure to have a specific meaning.

FIGS. 1 to 3 show a process example for forming a semiconductor device by a processing method of a wafer level. FIG. 1(a) shows a configuration of an electrode terminal formation surface of a semiconductor wafer 10 in which an electrode pad 14 is formed, and shows a state in which a surface of the semiconductor wafer 10 is coated with a passivation film 12 and the electrode pad 14 of aluminum is exposed from the passivation film 12. FIG. 1(b) shows a state in which an insulating layer 16 is formed on a surface of the passivation film 12. The insulating layer 16 can be formed by coating the surface of the passivation film 12 with an insulating material such as a polyimide film and exposing the electrode pad 14.

Figure 1A:
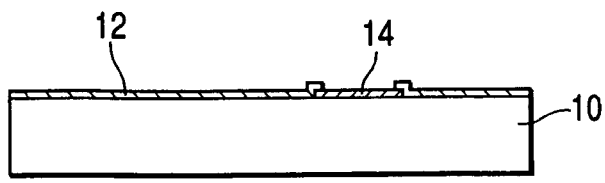
FIG. 1 is an explanatory diagram showing a manufacturing process of forming a rewiring pattern by processing of a wafer level.
Figure 1B:
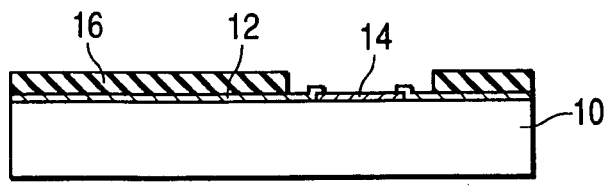
Figure 1C:
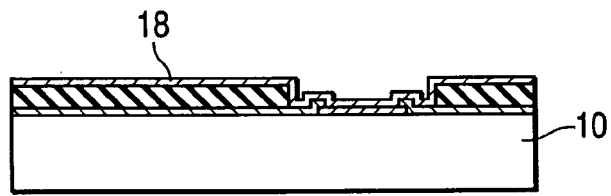

Next, FIG. 1(c) shows a state in which surfaces of the electrode pad 14 and the insulating layer 16 are coated with an undercoat metal layer 18. The undercoat metal layer 18 is formed, for example, by sputtering chromium and then sputtering copper.

Figure 1D:
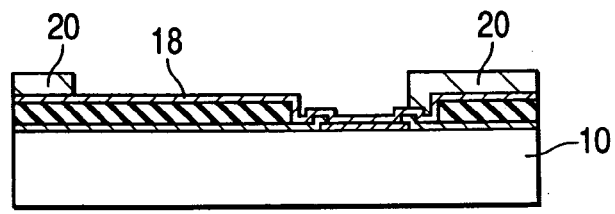

FIG. 1(d) shows a state in which a resist pattern 20 for forming a rewiring pattern is formed on a surface of the undercoat metal layer 18 by a predetermined pattern.

Figure 1E:
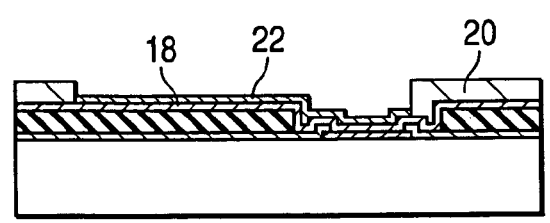
Figure 1F:
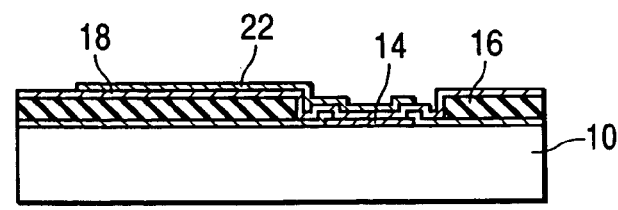

FIG. 1(e) is a state in which copper plating is performed using the undercoat metal layer 18 as a plating feeding layer and a conductor layer resulting in a rewiring pattern 22 is formed on an exposed portion of the undercoat metal layer 18. FIG. 1(f) shows a state in which the resist pattern 20 is removed. The rewiring pattern 22 is formed in a state of being electrically connected to the electrode pad 14.

FIG. 2 shows a process of forming an external connection terminal on the rewiring pattern 22. FIG. 2(a) shows a state in which a resist pattern 24 is formed so as to expose a region for forming an external connection terminal on the rewiring pattern 22 in order to form the external connection terminal by plating. Numeral 24a is an exposure hole in which the rewiring pattern 22 is exposed from the resist pattern 24.

Figure 2A:
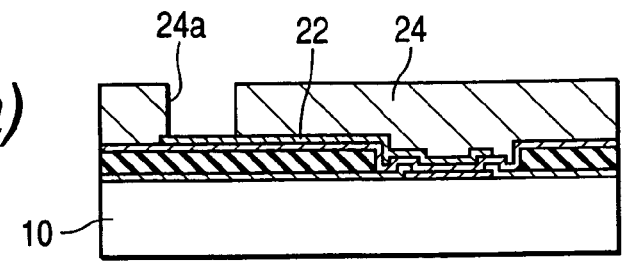
FIG. 2 is an explanatory diagram showing a manufacturing process of forming an external connection terminal on the rewiring pattern by the processing of the wafer level.
Figure 2B:
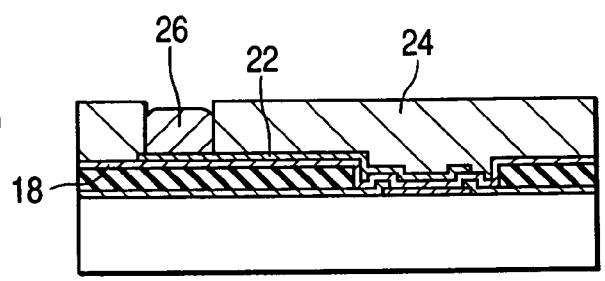

FIG. 2(b) shows a state in which copper plating is performed using the undercoat metal layer 18 as a plating feeding layer and the copper plating is heaped up in the exposure hole 24a and a copper post 26 is formed.

Figure 2C:
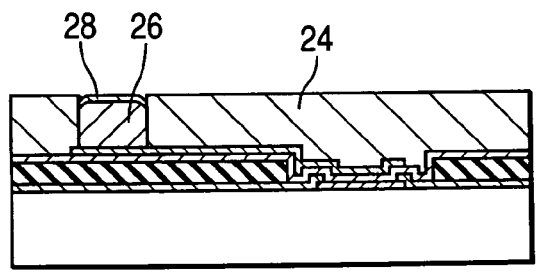

FIG. 2(c) shows a state in which a barrier metal layer 28 is covered and formed on an exposure end face of the top of the copper post 26. The barrier metal layer 28 can be formed, for example, by performing nickel plating and gold plating in this order.

Figure 2D:
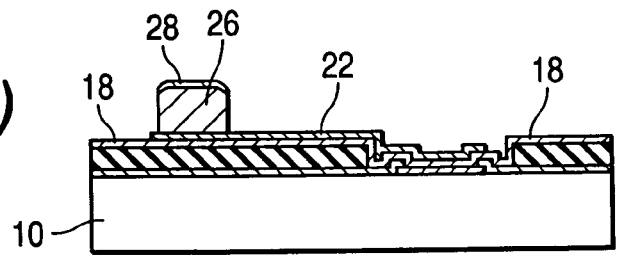

FIG. 2(d) shows a state in which the resist pattern 24 is removed. By removing the resist pattern 24, an external connection terminal 30 is exposed to the outside, and the undercoat metal layer 18 and the rewiring pattern 22 formed on a surface of the undercoat metal layer 18 are exposed to a surface of the semiconductor wafer 10.

Figure 2E:
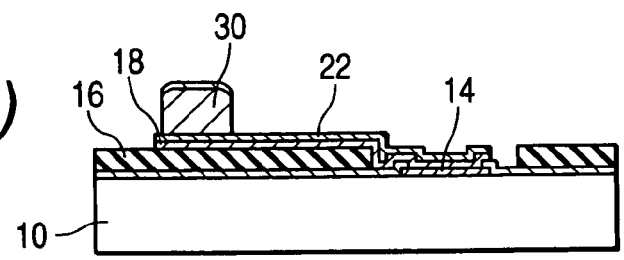

FIG. 2(e) is a state in which an exposure portion of the undercoat metal layer 18 is etched and the insulating layer 16 is exposed to a surface of the semiconductor wafer 10, and the rewiring pattern 22 is formed on a surface of the insulating layer 16 in a predetermined independent pattern. A region coated with the rewiring pattern 22 in the undercoat metal layer 18 is left on the insulating layer 16, and the rewiring pattern 22 is electrically connected to the electrode pad 14 and the external connection terminal 30 is electrically connected to the electrode pad 14 through the rewiring pattern 22.

FIG. 3 shows a process of sealing an electrode terminal formation surface of the semiconductor wafer 10 in which the external connection terminal 30 described above is formed by resin.

Figure 3A:
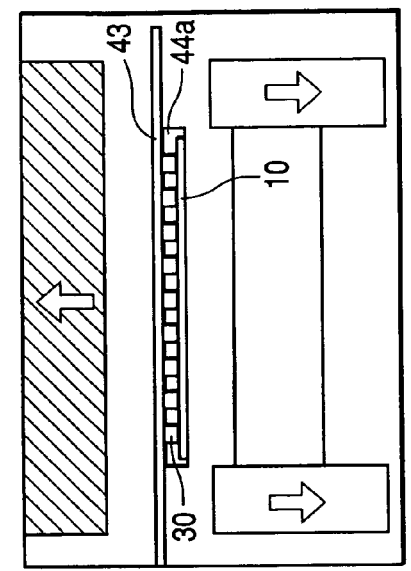
FIG. 3 is an explanatory diagram showing a method for sealing a surface on which the external connection terminal of a semiconductor wafer is formed by resin.

FIG. 3(a) shows a state in which the semiconductor wafer 10 in which the external connection terminal 30 is formed is set in the side of a lower mold of a resin sealing apparatus. Numeral 40 is an upper mold, and numeral 41 is an inside lower mold, and numeral 42 is an outside lower mold. Numeral 43 is a temporary film for coating a molding surface of the upper mold 40. The semiconductor wafer 10 is arranged in a state in which a surface in which the external connection terminal 30 is formed is directed toward the upper mold 40, and a resin tablet 44 is supplied on the semiconductor wafer 10.

Figure 3D:
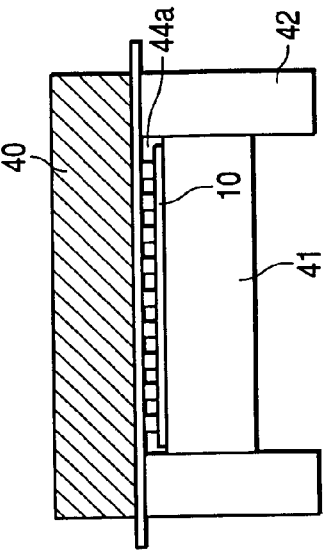
Figure 3B:
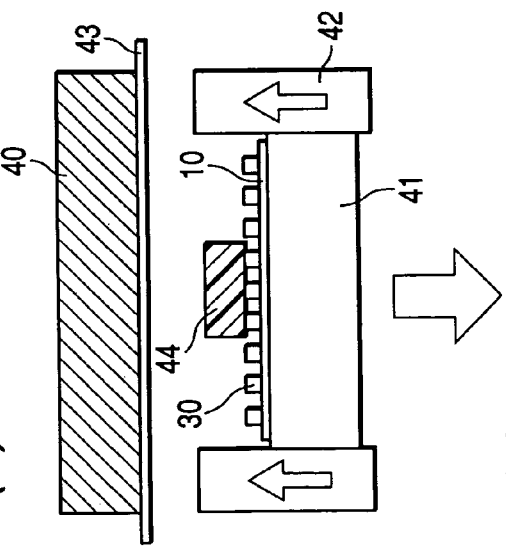

FIG. 3(b) shows a state in which clamping of the semiconductor wafer 10 is started by a metal mold. After the outer periphery of the semiconductor wafer 10 is closed by the upper mold 40 and the outside lower mold 42, the semiconductor wafer 10 together with the resin tablet 44 are clamped by the inside lower mold 41 and the upper mold 40, and resin 44a melted by heating is gradually charged into a cavity 45.

Figure 3C:
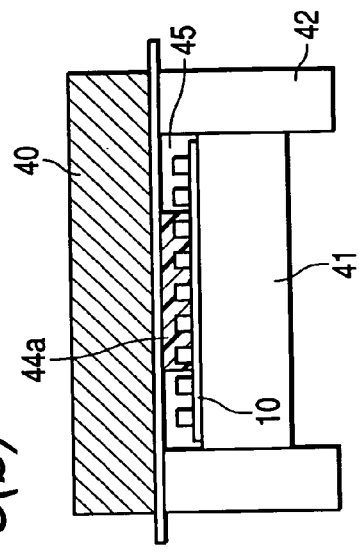

FIG. 3(c) shows a state in which the metal mold is clamped to a mold clamping position and the resin 44a is fully charged into the whole cavity 45 and the semiconductor wafer 10 is compressed and molded.

FIG. 3(d) shows a state in which the mold is opened after the resin 44a hardens. Thus, the surface of the semiconductor wafer 10 in which the external connection terminal 30 is formed is fully sealed by the resin 44a. By the resin sealing through the temporary film 43, an end face of the external connection terminal 30 is exposed to a surface of the resin 44a.

After the surface of the semiconductor wafer 10 in which the external connection terminal 30 is formed is sealed by the resin 44a, the temporary film 43 is peeled and a solder ball 46 is joined to the end face of the external connection terminal 30. Thereafter, semiconductor device of individual segments can be obtained by cutting the semiconductor wafer 10 together with the resin 44a every area of semiconductor chips.

Figure 4A:
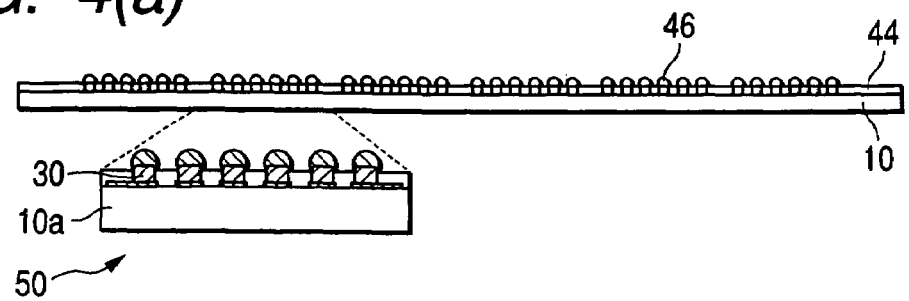
FIG. 4 is an explanatory diagram showing an example of a semiconductor device formed by the processing of the wafer level.

FIG. 4(a) shows a state of joining the solder ball 46 to the end face of the external connection terminal 30 and a configuration of a semiconductor device 50 (chip size package) in which the semiconductor wafer 10 is cut into individual segments. Numeral 10a is a semiconductor chip cut into individual segments.

Figure 4B:
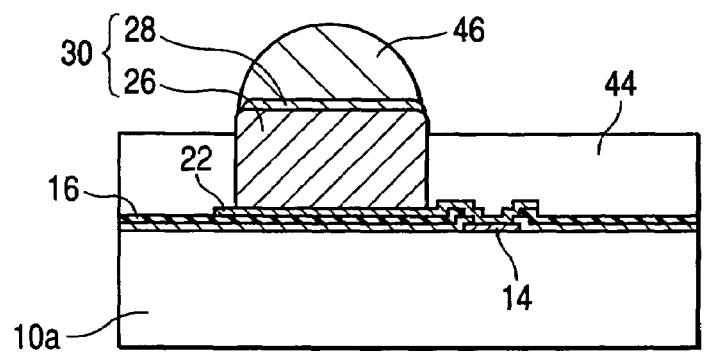

FIG. 4(b) enlarges and shows a state in which the surface of the semiconductor device 50 in which the external connection terminal 30 is formed is sealed by the resin 44a and the solder ball 46 and the external connection terminal 30 are electrically connected to the electrode pad 14 of the semiconductor chip through the rewiring pattern 22.

The manufacturing method of the semiconductor device described above shows an example of a manufacturing process of manufacturing the semiconductor device by processing of a wafer level. A manufacturing method of a semiconductor device according to the present invention is characterized in that in the case of performing a treatment for forming the rewiring pattern 22 or forming the external connection terminal 30 at the wafer level as described above, on the basis of results in which individual semiconductor chips are inspected at a stage of manufacturing the semiconductor wafer 10, a treatment different from treatment with respect to a semiconductor chip judged as a conforming product described above is performed with respect to a semiconductor chip judged as a nonconforming product.

That is, in the related art, in the case of the wafer level processing, the rewiring pattern 22 is formed or a plating treatment is performed in like manner with respect to all the semiconductor chips of the semiconductor wafer. However, in the present invention, with respect to a semiconductor chip judged as a nonconforming product by inspection at the stage of manufacturing the semiconductor wafer, a treatment different from that of a semiconductor chip of a conforming product is performed so as not to damage an inspection apparatus or have adverse influence on a semiconductor device of a conforming product in the case of a treatment such as burn-in or an inspection after forming the semiconductor device by forming the rewiring pattern 22 or the external connection terminal 30 and performing sealing by resin.

The treatment different from treatment with respect to a semiconductor chip of a conforming product refers to a treatment performed so as not to damage an inspection apparatus in the case of an inspection after forming a semiconductor device or have adverse influence on a semiconductor device of a conforming product in the case of burn-in. For example, there is a treatment in which an inspection apparatus or a burn-in apparatus is completely electrically disconnected from a semiconductor chip of a nonconforming product in order to avoid a problem that the semiconductor chip of the nonconforming product is electrically short-circuited and an overcurrent flows at the time of inspection.

Figure 5:
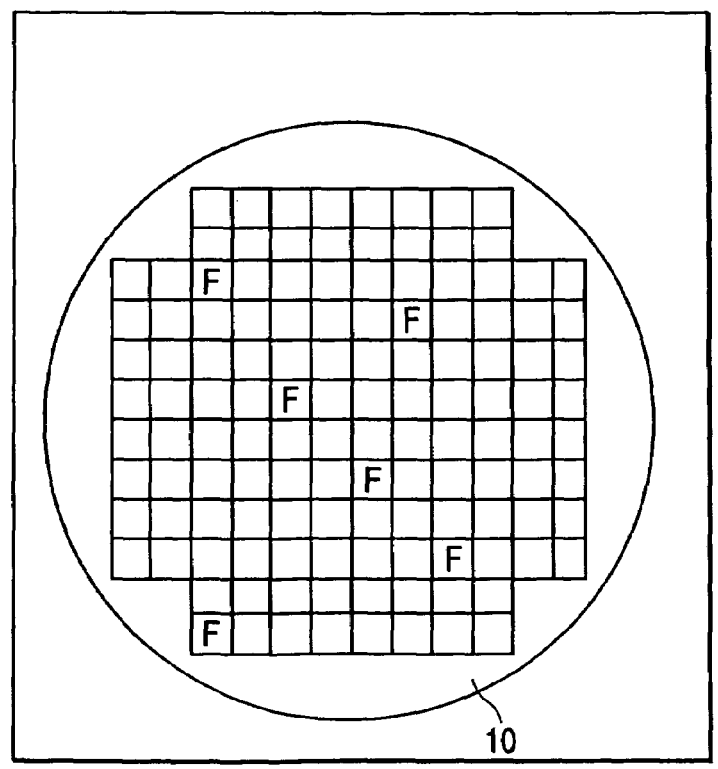
FIG. 5 is an explanatory diagram showing an example of an arrangement position (map) of semiconductor chips judged as nonconforming products by testing a semiconductor wafer.

FIG. 5 shows a result (wafer electrical nonconformity map) of judging conformity and nonconformity of semiconductor chips by testing electrical characteristics etc. of individual semiconductor chips at a manufacturing stage of a semiconductor wafer. FIG. 5 shows the semiconductor chips in which division portions described as F are judged as nonconformity.

Figure 6:
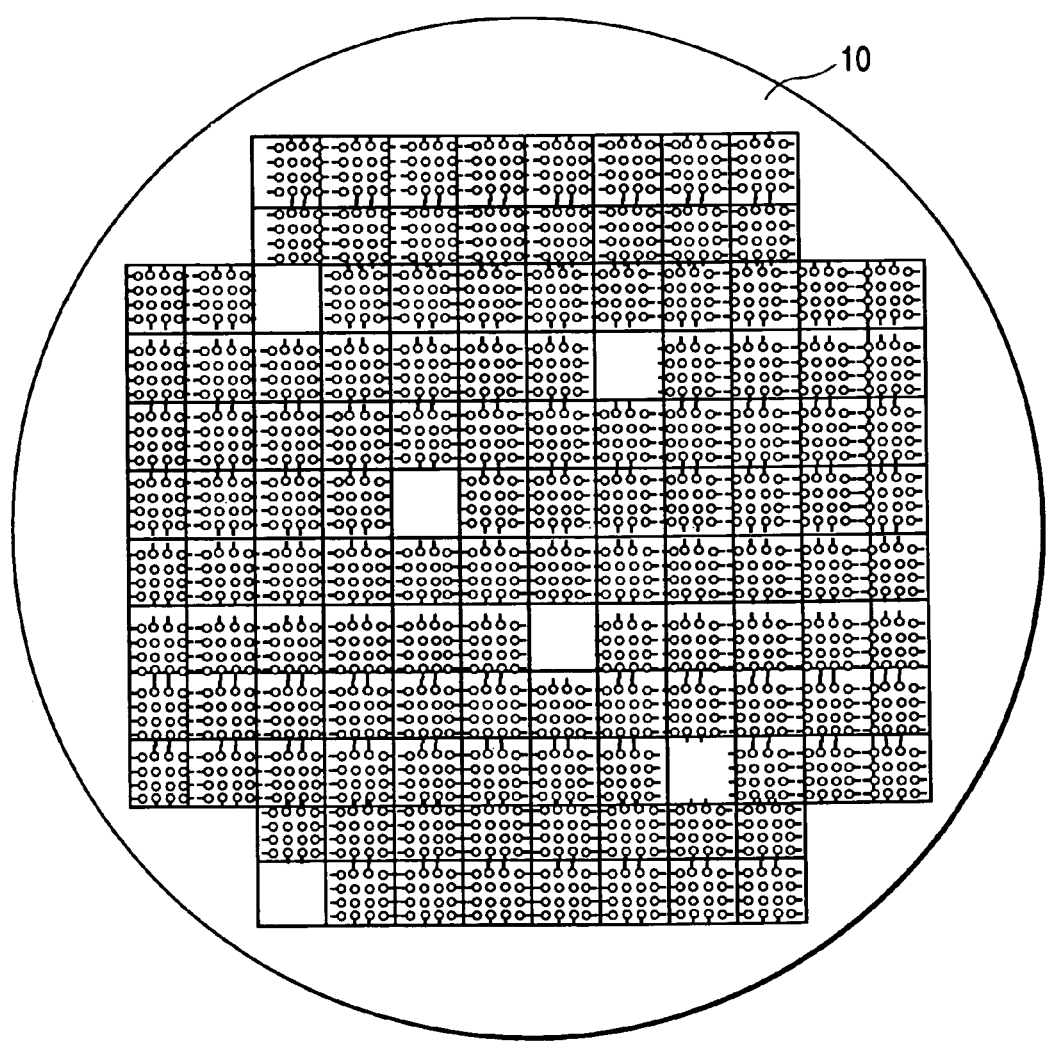
FIG. 6 is an explanatory diagram showing a state in which rewiring patterns are not formed in the semiconductor chips judged as the nonconforming products in the semiconductor wafer.

FIG. 6 explanatorily shows a state of forming rewiring patterns on an electrode terminal formation surface of the semiconductor wafer 10. FIG. 6 shows that the rewiring patterns are not formed in regions of the semiconductor chips judged as nonconformity in FIG. 5. Incidentally, for convenience of description, external connection terminals are not shown with respect to the semiconductor chips judged as nonconformity in FIG. 6. By being constructed so as not to form the rewiring patterns 22 with respect to the semiconductor chips judged as nonconforming products, an inspection apparatus or a burn-in apparatus is electrically disconnected from the semiconductor chips and the semiconductor chips of the nonconforming products do not have adverse influence on the inspection apparatus or the burn-in apparatus.

FIG. 7 shows one exemplary, non-limiting example of a method constructed so that rewiring patterns 22 are not electrically connected to electrode pads 14 with respect to regions of semiconductor chips judged as nonconforming products in the case of forming the rewiring patterns 22 on the electrode terminal formation surface of the semiconductor wafer 10 shown in FIGS. 1 to 4 described above.

Figure 7A:
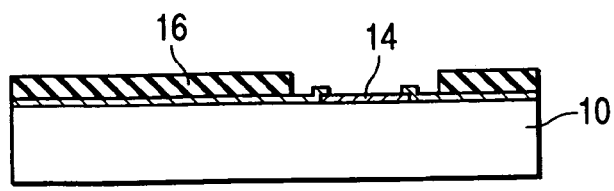
FIG. 7 is an explanatory diagram showing an exemplary, non-limiting treatment method in which rewiring patterns are not formed in semiconductor chips judged as nonconforming products by applying a resist.
Figure 7B:
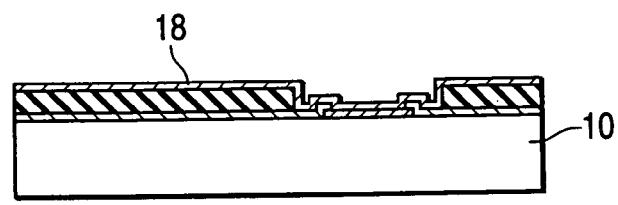
Figure 7C:
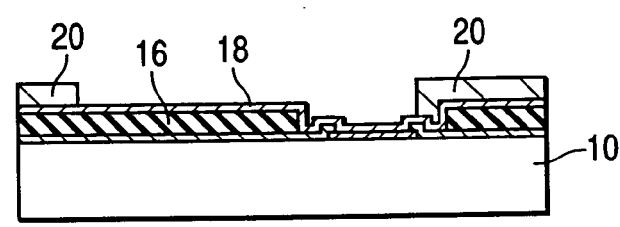

That is, FIG. 7(a) shows a state in which an insulating layer 16 is formed on a surface of a semiconductor wafer 10, and FIG. 7(b) shows a state in which a surface of the semiconductor wafer 10 is coated with an undercoat metal layer 18, and FIG. 7(c) shows a state in which a resist pattern 20 is formed so as to expose a region for forming a rewiring pattern 22 on a surface of the undercoat metal layer 18. These processes are the same as the processes from FIG. 1(b) to FIG. 1(d).

Figure 7D:
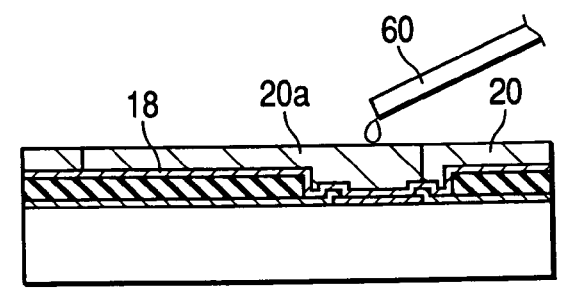

In the present method, after the process of FIG. 7(c), with respect to a region of a semiconductor chip judged as nonconformity, in order to form the rewiring pattern 22, a resist 20a is dropped to a region to which the undercoat metal layer 18 is exposed so that the region to which the undercoat metal layer 18 is exposed is coated as shown in FIG. 7(d).

Figure 9A:
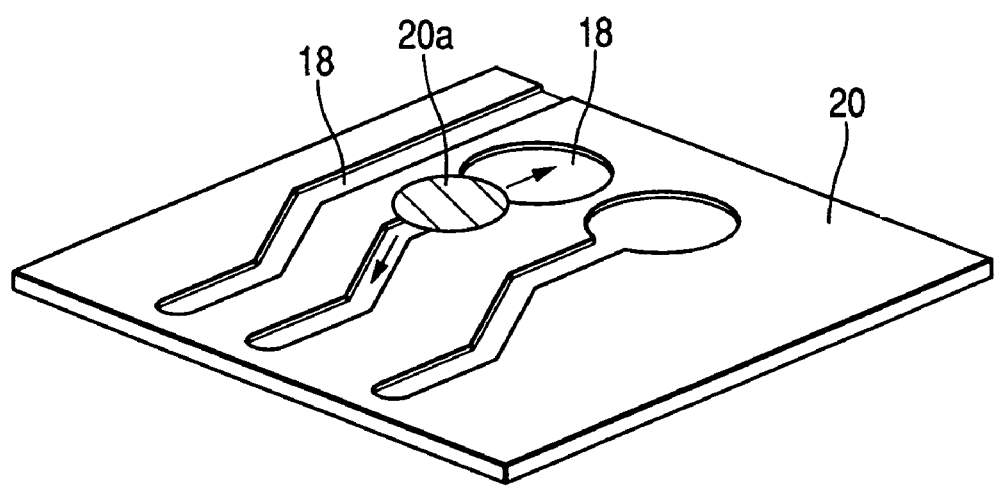
FIG. 9 is an explanatory diagram showing an exemplary, non-limiting method for coating an under coat metal layer by applying a resist to a region for forming a rewiring pattern.
Figure 9B:
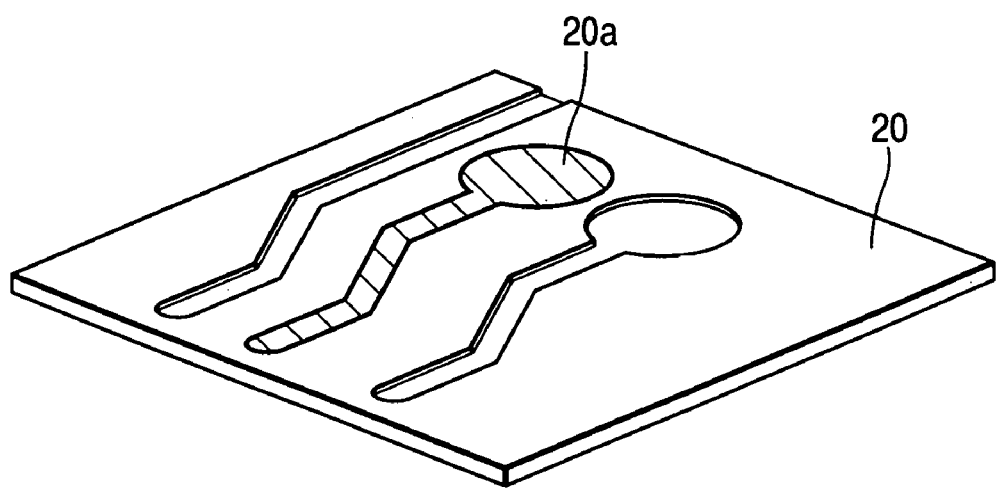

FIG. 9 shows a state in which a resist pattern 20 is formed on a surface of an undercoat metal layer 18 by a perspective view. FIG. 9(a) shows a state in which a resist 20a is dropped to a region to which the undercoat metal layer 18 is exposed in order to form a rewiring pattern 22, and FIG. 9(b) shows a state in which the region to which the undercoat metal layer 18 is exposed is coated with the resist 20a. Since the region to which the undercoat metal layer 18 is exposed is formed in groove shape, the resist 20a flows along the groove and the resist 20a flows so as to bury the groove and the region of undercoat metal layer 18 is coated.

Incidentally, when an exposed portion forming the rewiring pattern 22 is coated with the resist 20a, it is unnecessary to coat the whole area of a surface of a semiconductor chip judged as nonconformity with the resist 20a. A method for coating only a portion forming a required rewiring pattern 22 so that an electrical short circuit does not occur in the case of testing a semiconductor device may be used.

Figure 10:
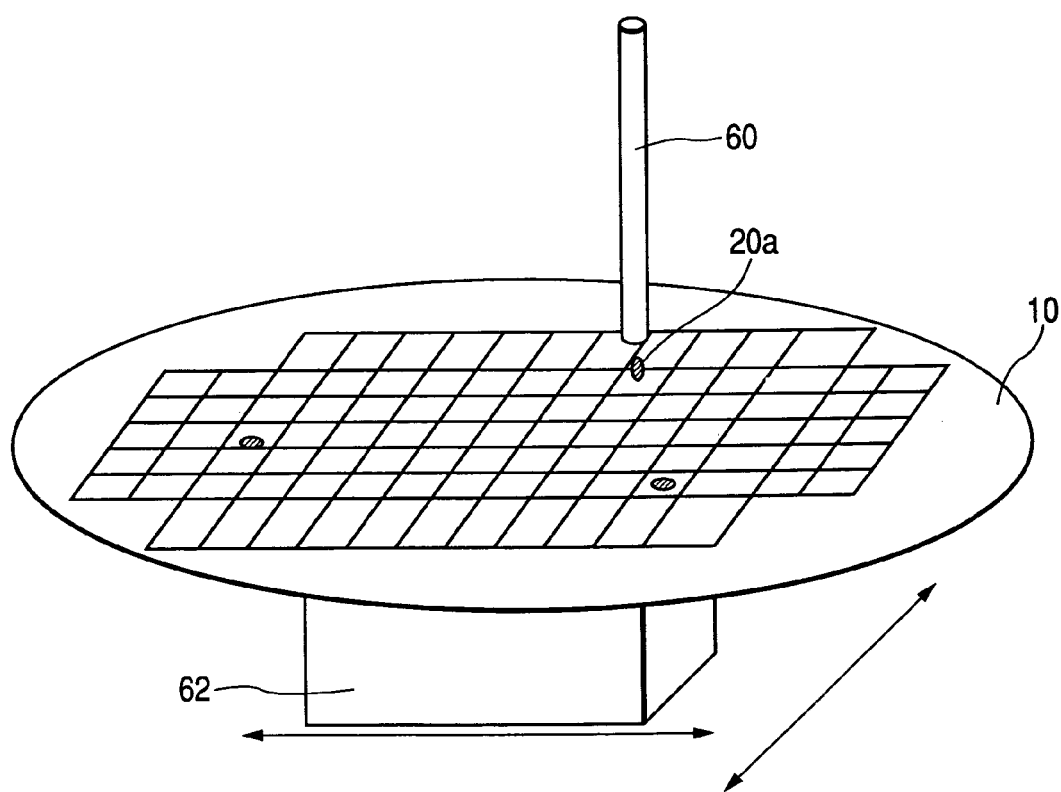
FIG. 10 is an explanatory diagram showing an exemplary, non-limiting treatment method in which rewiring patterns are not formed by applying a resist to semiconductor chips judged as nonconforming products in a semiconductor wafer.

FIG. 10 shows a state in which using a nozzle 60, a resist 20a is applied to regions of semiconductor chips judged as nonconforming products in a semiconductor wafer 10 based on results of inspecting individual semiconductor chips at a manufacturing stage of a semiconductor wafer. Since the inspection results of the semiconductor wafer are stored as map data, the semiconductor wafer 10 in which a resist pattern 20 is formed is sucked and supported on an X-Y stage 62 and based on the map data of the inspection results of the semiconductor wafer 10, the semiconductor chips of the nonconforming products are aligned with the nozzle 60 and the resist 20a is applied to surfaces of the semiconductor chips. Therefore, a treatment shown in FIG. 7(d) can be performed with respect to all the semiconductor chips judged as the nonconforming products in the semiconductor wafer 10.

Figure 7E:
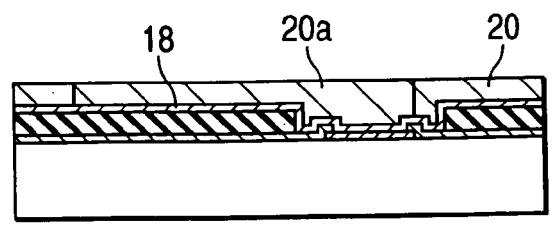

FIG. 7(e) is a process of forming a conductor layer resulting in the rewiring pattern 22 on an exposed surface of the undercoat metal layer 18 using the undercoat metal layer 18 as a plating feeding layer. In FIG. 7(e), the undercoat metal layer 18 is coated with the resist 20a, so that the conductor layer is not formed on a surface of the undercoat metal layer 18. On the other hand, the rewiring pattern 22 is formed on the surface of the undercoat metal layer 18 with respect to a semiconductor chip judged as a conforming product as shown in FIG. 1(e).

Figure 7F:
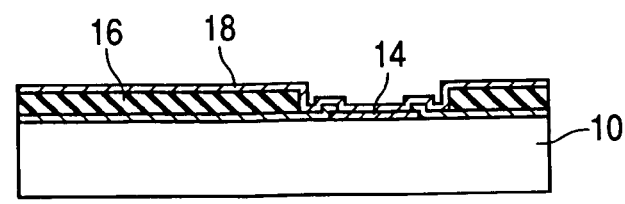
Figure 8A:
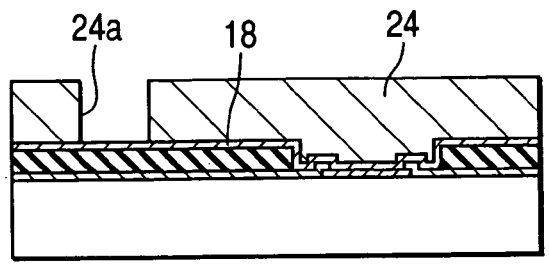
FIG. 8 is an explanatory diagram showing a process of forming an external connection terminal on a semiconductor chip judged as a nonconforming product.
Figure 8B:
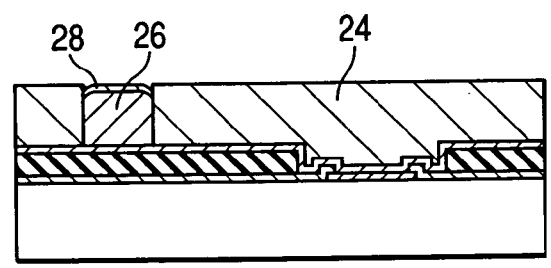
Figure 8C:
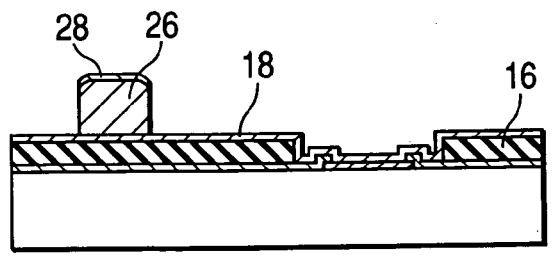
Figure 8D:
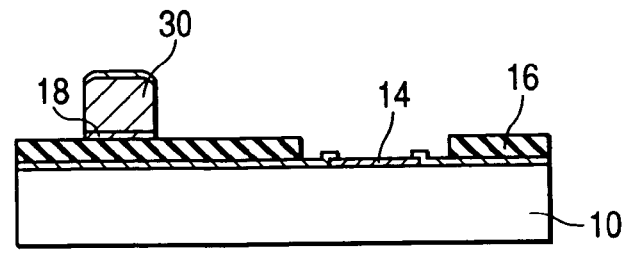

After a process of forming the rewiring pattern 22, the resist pattern 20 is removed. FIG. 7(f) shows a state of removing the resist pattern 20 and the resist 20a.

After removing the resist pattern 20 and the resist 20a, an external connection terminal 30 is formed in the same process as the process shown in FIG. 2. A process of forming the external connection terminal 30 is shown in FIG. 8. In a manner similar to the process shown in FIG. 2, a resist pattern 24 is formed (FIG. 8(a)) and a copper post 26 is formed by plating using the undercoat metal layer 18 as a plating feeding layer (FIG. 8(b)) and the external connection terminal 30 is formed. As shown in FIG. 2, the external connection terminal 30 is formed on the rewiring pattern 22 with respect to a semiconductor chip of a conforming product. On the other hand, the external connection terminal 30 is formed on the undercoat metal layer 18 without intervention of a conductor layer resulting in the rewiring pattern 22 with respect to a semiconductor chip of a nonconforming product (FIG. 8(c)).

After forming the external connection terminal 30, the undercoat metal layer 18 is etched and removed. Therefore, with respect to a region in which the semiconductor chip of the nonconforming product is formed, the undercoat metal layer 18 remains in only a region in which the external connection terminal 30 is formed so that the external connection terminal 30 is electrically disconnected from an electrode pad 14 (FIG. 8(d)).

Formation of the external connection terminal 30 with respect to the semiconductor chip judged as the nonconforming product in the semiconductor wafer 10 thus has an advantage capable of forming the external connection terminal 30 made of the copper post 26 with normal shape. When the external connection terminal 30 made of the copper post 26 is formed by electrolytic plating, a process is adjusted so that plating conditions (current density or plating deposition speed) on the semiconductor wafer become uniform in each of the regions (the center and periphery of the wafer) of the semiconductor wafer. Therefore, in the case of being constructed so that the copper post 26 is not formed on a nonconforming chip, the plating conditions in each of the regions on the semiconductor wafer become nonuniform and the copper post 26 with normal shape cannot be formed on a conforming chip. On the other hand, in the method of the present embodiment, the copper post 26 is formed even when the rewiring pattern 22 is not formed, so that such a problem can be avoided.

Incidentally, in the embodiment, plating of the rewiring pattern is not performed on the nonconforming chip, so that the plating conditions on the semiconductor wafer become nonuniform strictly. However, a plating thickness (5 to 10 μm) of the rewiring pattern is very thin as compared with a height (about 100 μm) of the copper post, so that there is no problem actually.

Also, the external connection terminals 30 are formed on the nonconforming chips, so that the external connection terminals 30 are uniformly present on the semiconductor wafer. Hence, in the case of making inspection of burn-in etc. on a semiconductor device, contact pressure of a contact probe of an inspection apparatus becomes uniform on the external connection terminals of each of the regions on the semiconductor wafer and connection between each of the external connection terminals and the contact probe can be made well and accurate inspection can be made.

Also, by forming the external connection terminals 30 on the nonconforming chips, it is unnecessary to change a metal mold for sealing the semiconductor wafer 10 by resin and there is also an advantage capable of using a related-art apparatus without change.

FIG. 11 shows an exemplary, non-limiting example of manufacture using a negative type resist as a method in which a rewiring pattern 22 is not formed with respect to a semiconductor chip judged as a nonconforming product. FIGS. 11(a) and 11(b) are the same process as that of FIGS. 7(a) and 7(b) and show a process of forming an insulating layer 16 on a surface of a semiconductor wafer 10 and further forming an undercoat metal layer 18. FIG. 11(c) shows a state in which a surface of the undercoat metal layer 18 is coated with a negative resist 20b in order to form the rewiring pattern 22.

For the negative resist, a region irradiated with light remains. Therefore, with respect to a semiconductor chip of a conforming product, it is constructed so as not to irradiate a region for forming the rewiring pattern 22 with light using a mask. On the other hand, with respect to a semiconductor chip of a nonconforming product, it is constructed so as to irradiate the region for forming the rewiring pattern 22 with focused light such as laser light as shown in FIG. 11(d).

Figure 11A:
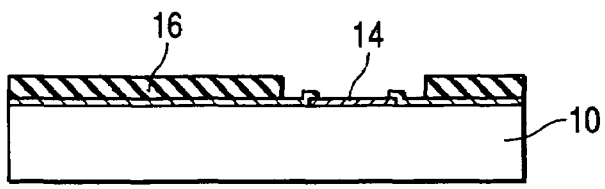
FIG. 11 is an explanatory diagram showing an exemplary, non-limiting treatment method in which a rewiring pattern is not formed with respect to a semiconductor chip judged as a nonconforming product using a negative resist.
Figure 11B:
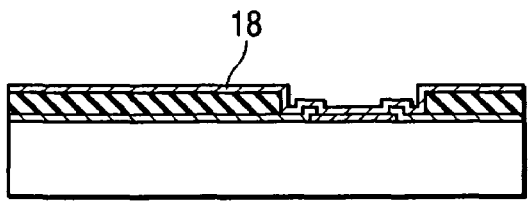
Figure 11C:
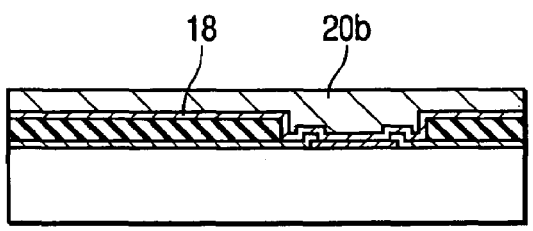
Figure 11D:
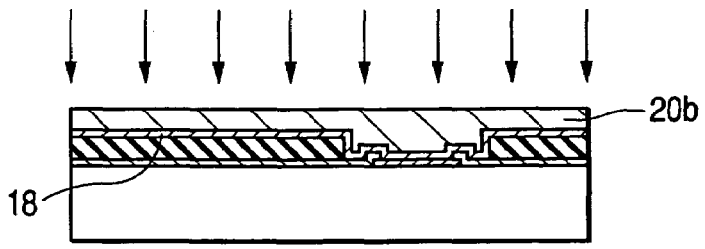
Figure 11E:
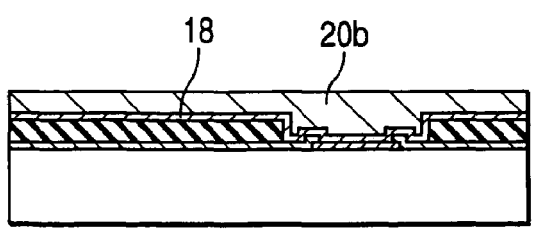
Figure 11F:
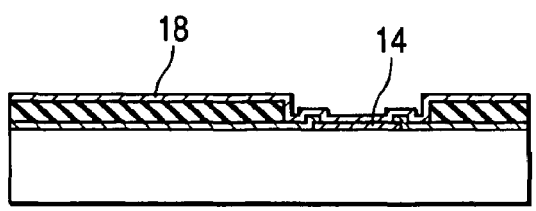
Figure 12:
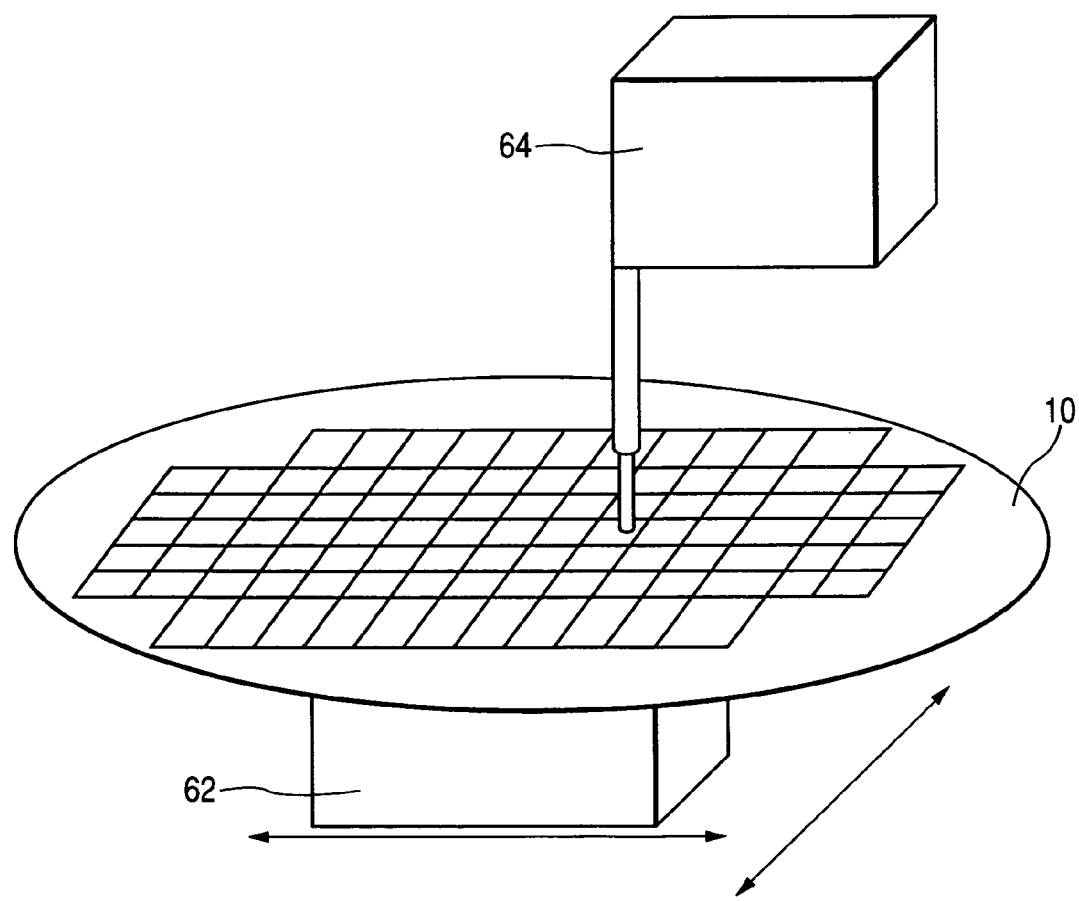
FIG. 12 is an explanatory diagram showing a state of performing treatment in which a rewiring pattern is not formed by irradiating a semiconductor chip judged as a nonconforming product in a semiconductor wafer with ultraviolet light.

FIG. 12 shows a state in which a position of a semiconductor chip judged as a nonconforming product is irradiated with light (ultraviolet light) in a spot manner in a state (state of FIG. 11(c)) of coating a surface of a semiconductor wafer 10 with the negative resist 20b based on inspection results at a manufacturing stage of the semiconductor wafer 10. The semiconductor chip judged as the nonconforming product can be irradiated with the light from a light source 64 by positioning and moving the semiconductor wafer 10 by an X-Y stage 62 based on map data of the inspection results of the semiconductor wafer 10. Since an operation of irradiating the semiconductor chip of the nonconforming product with light so that the resist remains in a region for forming a rewiring pattern 22 can be performed by adding a spot light irradiation process after an exposure process using a mask for forming a predetermined resist pattern 20, there is an advantage that a work load is small.

Also in the case by this method, the rewiring pattern 22 is not formed with respect to the semiconductor chip judged as the nonconforming product and in a manner completely similar to the process shown in FIGS. 7 and 8, the semiconductor chip judged as the nonconforming product can be rendered a state in which an electrode pad 14 is electrically disconnected from an external connection terminal 30.

Figure 13:
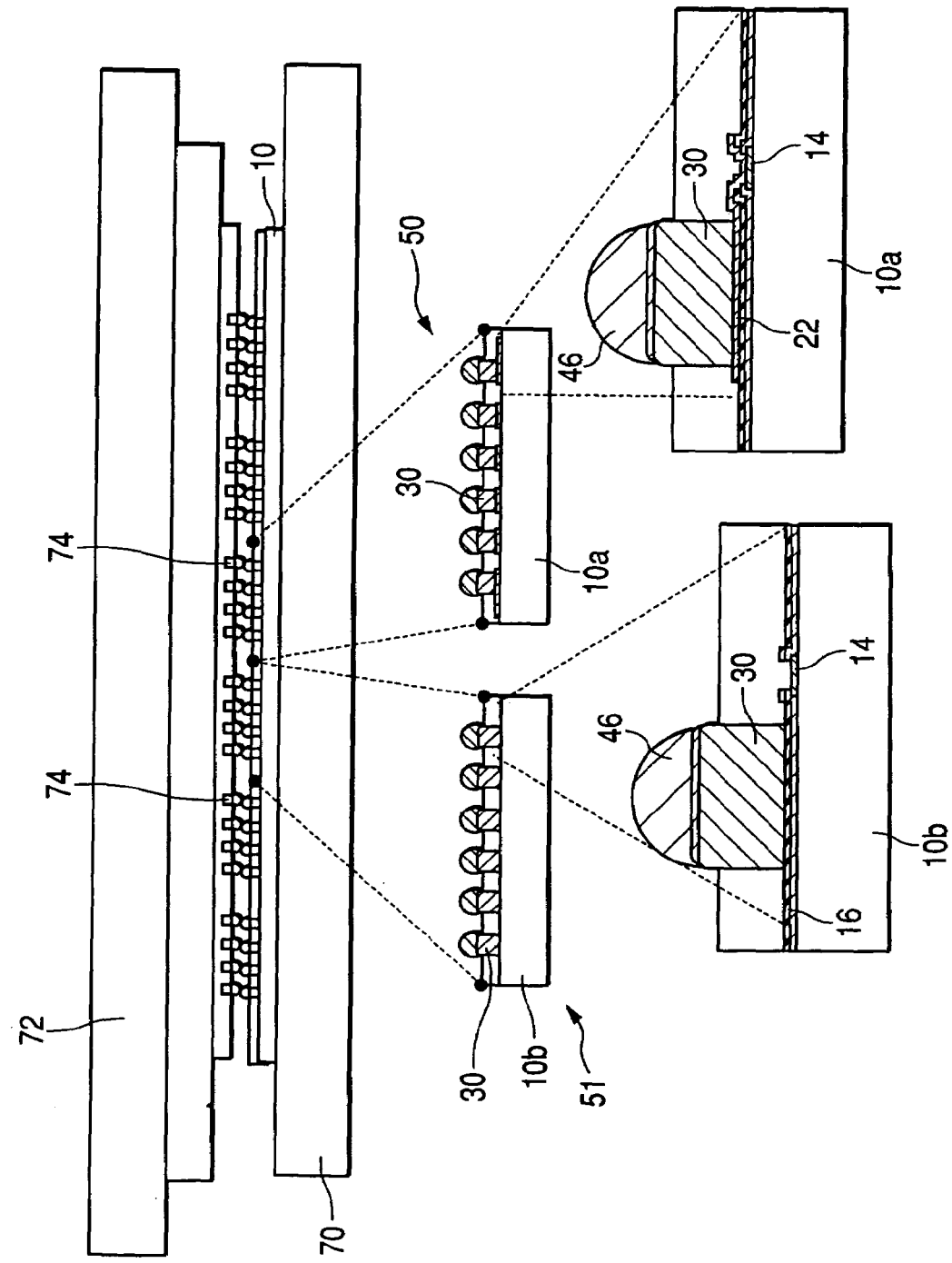
FIG. 13 is an explanatory diagram showing a state of performing burn-in of a semiconductor device.

FIG. 13 shows a state of performing burn-in after a surface on which an external connection terminal 30 of a semiconductor wafer 10 is formed is sealed by resin 44a. Numeral 70 is a support chuck of the semiconductor wafer 10, and numeral 72 is a contactor, and numerals 74 are contact bumps (contact probes). In a burn-in operation, the semiconductor wafer 10 after resin sealing is clamped by the support chuck 70 and the contactor 72 and is heated inside an oven and also the contact bumps 74 are pressed and contacted to the external connection terminals 30 of respective semiconductor device and a voltage higher than a normal working voltage is applied.

In FIG. 13, numeral 50 is a semiconductor device in which a semiconductor chip 10a is judged as a conforming product and numeral 51 is a semiconductor device in which a semiconductor chip 10b is judged as a nonconforming product. It is shown that an electrode pad 14 is electrically connected to the external connection terminal 30 through a rewiring pattern 22 in the semiconductor device 50 made of the semiconductor chip 10a of the conforming product. Also, it is shown that the electrode pad 14 is electrically disconnected from the external connection terminal 30 in the semiconductor device 51 made of the semiconductor chip 10b of the nonconforming product. As described above, by forming the external connection terminal 30 with respect to the semiconductor chip judged as the nonconforming product in a manner similar to the conforming product, the semiconductor wafer 10 can surely be clamped by the support chuck 70 and the contactor 72.

According to the manufacturing method of the semiconductor device of the present invention, as described above, the semiconductor chip 10b is electrically disconnected from the external connection terminal 30 with respect to the semiconductor device 51 made of the semiconductor chip 10b judged as the nonconforming product. Therefore, the contactor 72 is electrically separated from the semiconductor chip 10b judged as the nonconforming product and an overcurrent can be prevented from flowing in the semiconductor chip 10b. Therefore, a burn-in apparatus is not damaged and adverse influence on the semiconductor chip 10a of the conforming product in the vicinity due to overheating of the semiconductor chip of the nonconforming product can be prevented.

Incidentally, a method for manufacturing a semiconductor device by processing of a wafer level is not limited to the manufacturing method described above, and can also be achieved by other methods, and a form of a chip size package also includes several kinds.

For example, in the method described above, the undercoat metal layer 18 is formed and the conductor layer resulting in the rewiring pattern 22 is formed and then the copper post 26 resulting in the external connection terminal 30 is formed by copper plating. However, instead of forming the copper post 26, there is also a method for forming an external connection terminal by merely joining a solder ball to a rewiring pattern 22. Its manufacturing method is shown in FIG. 14.

Figure 14A:
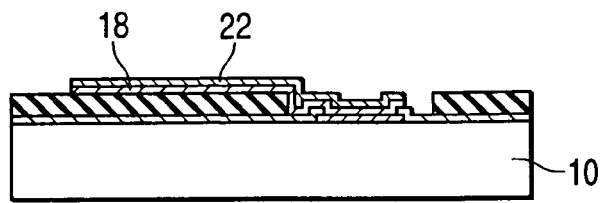
FIG. 14 is an explanatory diagram showing an exemplary, non-limiting method for manufacturing a semiconductor device by processing of a wafer level.
Figure 14B:
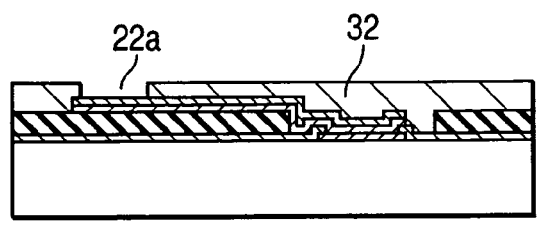
Figure 14C:
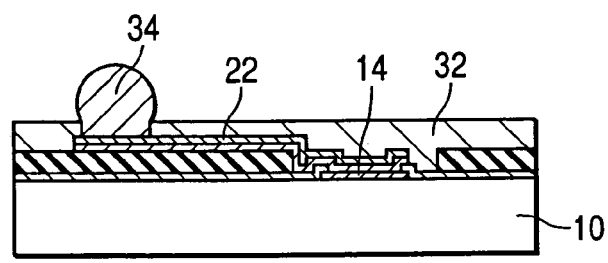

FIG. 14(a) shows a state in which a rewiring pattern 22 is formed on a surface of a semiconductor wafer 10 in a manner similar to the method shown in FIGS. 1(a) to 1(f). FIG. 14(b) shows a state in which a polyimide film etc. are laminated on the surface of the semiconductor wafer 10 to form an insulating film 32 and a pad 22a for joining a solder ball is exposed. FIG. 14(c) is a state of forming an external connection terminal by joining a solder ball 34 to the pad 22a.

Figure 14D:
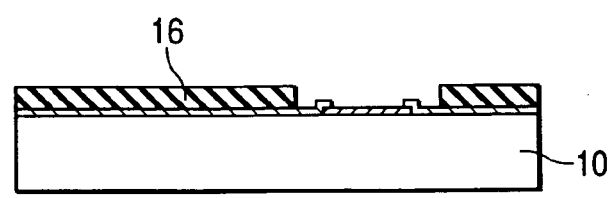
Figure 14E:
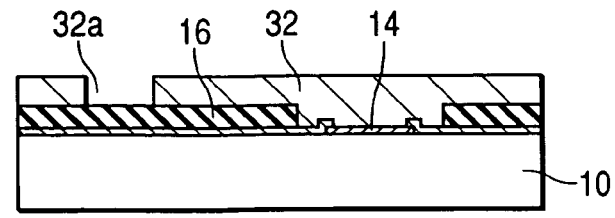

Also for this manufacturing method, in this case of forming a resist pattern for forming the rewiring pattern on a surface of the undercoat metal layer, in a manner similar to that shown in FIG. 10 or FIG. 12, with respect to a semiconductor chip judged as a nonconforming product, a region for forming the rewiring pattern is not exposed to the undercoat metal layer 18 so as not to form the rewiring pattern and thereby the rewiring pattern is not formed and the solder ball 34 is not joined and it can be rendered a state in which the solder ball and an electrode pad 14 are electrically disconnected from the outside. FIG. 14(d) shows a situation in which with respect to a region in which a nonconforming semiconductor chip is formed, a metal layer such as the rewiring pattern is not formed and the insulating layer 16 is exposed. Therefore, the solder ball is not joined to an opening 32a of the insulating film 32 after forming the insulating film 32 (FIG. 14(e)).

Thus, even in the case of different forms of the semiconductor device or different manufacturing methods, with respect to a semiconductor chip judged as a nonconforming product, required treatment is previously performed in the case of a process of forming a rewiring pattern at a wafer level so as not to have adverse influence on an inspection apparatus or a burn-in apparatus etc. after assembling the semiconductor device. Therefore, more accurate inspection can be performed and problems of having adverse influence on the inspection apparatus or having adverse influence on a semiconductor device of a conforming product can be avoided.

Incidentally, the embodiment described above shows the example of avoiding a situation in which an inspection apparatus etc. in a post-process are directly electrically connected to a semiconductor chip judged as a nonconforming product by previous inspection by means of a method applicable in a related-art manufacturing process of a semiconductor device of a wafer level. However, a method for electrically disconnecting the semiconductor chip of the nonconforming product from the inspection apparatus etc. is not limited to the method of the embodiment described above. For example, a method for forming a dummy external connection terminal with the same form as that of an external connection terminal 30 by burying a resin material made of an electrical insulator in an exposure hole 24a so that a copper post 26 is not formed with respect to a semiconductor chip of a nonconforming product in the case of forming the external connection terminal 30 can also be used. In this case, a rewiring pattern 22 may be formed also with respect to the semiconductor chip of the nonconforming product.

What is claimed is:

1. A method for manufacturing a semiconductor device at a wafer level, comprising the steps of:
    inspecting a plurality of individual semiconductor chips constituting a semiconductor wafer to judge whether each of said plurality of individual semiconductor chips is either a conforming or a nonconforming product;
    performing a first treatment to form a circuit including a rewiring pattern with respect to a first semiconductor chip of said plurality of individual semiconductor chips when said first semiconductor chip is judged during inspection to be conforming; and
    performing a second treatment to avoid an adverse influence on at least one of the semiconductor device of the conforming product and an inspection apparatus with respect to a second semiconductor chip of said plurality of individual semiconductor chips when the second semiconductor chip is judged during inspection to be nonconforming.

2. The method for manufacturing the semiconductor device as claimed in claim 1, wherein the second treatment for avoiding the adverse influence with respect to the second semiconductor chip judged as nonconforming includes electrically disconnecting the second semiconductor chip from a circuit electrically connected to an electrode pad of the second semiconductor chip.

3. The method for manufacturing the semiconductor device as claimed in claim 1, wherein the first treatment for forming the circuit with respect to the first semiconductor chip includes forming a rewiring pattern for electrically connecting an electrode pad of the first semiconductor chip to an external connection terminal, and
    wherein the second treatment for avoiding the adverse influence with respect to the second semiconductor chip includes not forming the rewiring pattern and disconnecting an electrode pad of the second semiconductor chip from the external connection terminal.

4. The method for manufacturing the semiconductor device as claimed in claim 3, wherein the treatment in which the rewiring pattern is not formed with respect to the second semiconductor chip includes:
    forming an undercoat metal layer on an electrode terminal formation surface of the semiconductor wafer,
    forming a resist pattern, to which a region for forming the rewiring pattern electrically connected to the electrode pad of the second semiconductor chip is exposed, on a surface of the undercoat metal layer,
    applying a resist to the region for forming the rewiring pattern resist with respect to the second semiconductor chip so that the region for forming the rewiring pattern is coated with the resist, and
    forming a conductor layer resulting in the rewiring pattern in only the first semiconductor chip by performing a plating using the undercoat metal layer as a plating feeding layer with respect to the semiconductor wafer.

5. The method for manufacturing the semiconductor device as claimed in claim 3, wherein the treatment in which the rewiring pattern is not formed with respect to the second semiconductor chip includes:

forming an undercoat metal layer on an electrode terminal formation surface of the semiconductor wafer, forming a resist pattern, to which a region for forming the rewiring pattern electrically connected to the electrode pad of the second semiconductor chip is exposed, on a surface of the undercoat metal layer so as to coat the region for forming the rewiring pattern with respect to the second semiconductor chip, and forming a conductor layer resulting in the rewiring pattern in only the first semiconductor chip by performing a plating using the undercoat metal layer as a plating feeding layer with respect to the semiconductor wafer.

* * * * *